United States Patent
Chen et al.

(10) Patent No.: US 10,535,676 B2
(45) Date of Patent: Jan. 14, 2020

(54) INTER-DIGITATED CAPACITOR IN SPLIT-GATE FLASH TECHNOLOGY

(71) Applicant: Taiwan Semiconductor Manufacturing Co., Ltd., Hsin-Chu (TW)

(72) Inventors: Wan-Chen Chen, Hsinchu (TW); Yu-Hsiung Wang, Zhubei (TW); Han-Yu Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/413,904

(22) Filed: May 16, 2019

(65) Prior Publication Data
US 2019/0273091 A1 Sep. 5, 2019

Related U.S. Application Data

(63) Continuation of application No. 15/481,618, filed on Apr. 7, 2017, now Pat. No. 10,297,608, which is a
(Continued)

(51) Int. Cl.
*H01L 21/28* (2006.01)
*H01L 29/94* (2006.01)
(Continued)

(52) U.S. Cl.
CPC .... *H01L 27/11575* (2013.01); *H01L 27/1157* (2013.01); *H01L 27/11573* (2013.01);
(Continued)

(58) Field of Classification Search
CPC ......... H01L 27/11524; H01L 27/11529; H01L 29/945; H01L 21/28282; H01L 29/42352; H01L 29/42344
See application file for complete search history.

(56) References Cited

U.S. PATENT DOCUMENTS 5,429,978 A * 7/1995 Lu .................. H01L 27/10835
257/E21.651
6,815,290 B2 11/2004 Lin et al.
(Continued)

FOREIGN PATENT DOCUMENTS

CN 101534610 A 9/2009
CN 103021867 A 4/2013
(Continued)

OTHER PUBLICATIONS

Non-Final Office Action dated Apr. 22, 2016 for U.S. Appl. No. 14/865,179.
(Continued)

*Primary Examiner* — William F Kraig
*Assistant Examiner* — Khatib A Rahman
(74) *Attorney, Agent, or Firm* — Eschweiler & Potashnik, LLC

(57) ABSTRACT

The present disclosure, in some embodiments, relates to an integrated chip. The integrated chip includes a plurality of upper electrodes separated from a semiconductor substrate by a first dielectric layer. A lower electrode is laterally disposed between the plurality of upper electrodes and between sidewalls of the semiconductor substrate. A second dielectric layer lines opposing sidewalls and a lower surface of the lower electrode. The second dielectric layer laterally separates the lower electrode from the plurality of upper electrodes and from the sidewalls of the semiconductor substrate.

20 Claims, 10 Drawing Sheets

Related U.S. Application Data continuation of application No. 14/865,179, filed on Sep. 25, 2015, now Pat. No. 9,691,780.

(51) Int. Cl.
| | |
|---|---|
| *H01L 27/11575* | (2017.01) |
| *H01L 49/02* | (2006.01) |
| *H01L 27/1157* | (2017.01) |
| *H01L 29/423* | (2006.01) |
| *H01L 29/66* | (2006.01) |
| *H01L 29/792* | (2006.01) |
| *H01L 27/11573* | (2017.01) |

(52) U.S. Cl.
CPC .............. *H01L 28/87* (2013.01); *H01L 28/88* (2013.01); *H01L 28/91* (2013.01); *H01L 29/40117* (2019.08); *H01L 29/42344* (2013.01); *H01L 29/42352* (2013.01); *H01L 29/66181* (2013.01); *H01L 29/66833* (2013.01); *H01L 29/792* (2013.01); *H01L 29/945* (2013.01)

(56) References Cited

U.S. PATENT DOCUMENTS

| | | | |
|---|---|---|---|
| 6,936,887 | B2 | 8/2005 | Harari et al. |
| 7,838,920 | B2 | 11/2010 | Ghodsi |
| 2004/0238880 | A1 | 12/2004 | Nagasaka et al. |
| 2005/0026380 | A1 | 2/2005 | Kammler et al. |
| 2006/0046378 | A1 | 3/2006 | Choi et al. |
| 2006/0138522 | A1 | 6/2006 | Kim |
| 2009/0090948 | A1 | 4/2009 | Sato |
| 2010/0163999 | A1 | 7/2010 | Jeong |
| 2012/0289021 | A1 | 11/2012 | Ching et al. |
| 2013/0240996 | A1 | 9/2013 | Yin et al. |
| 2015/0091079 | A1 | 4/2015 | Perera et al. |
| 2015/0132937 | A1 | 5/2015 | Kim et al. |
| 2016/0218112 | A1 | 7/2016 | Sekine et al. |
| 2017/0221916 | A1 | 8/2017 | Tseng et al. |

FOREIGN PATENT DOCUMENTS

| | | |
|---|---|---|
| JP | H07111312 A | 4/1995 |
| JP | 2009071325 A | 4/2009 |
| WO | 2008088654 A1 | 7/2008 |

OTHER PUBLICATIONS

Final Office Action dated Nov. 3, 2016 for U.S. Appl. No. 14/865,179.
Notice of Allowance dated Jan. 19, 2017 for U.S. Appl. No. 14/865,179.
Non-Final Office Action dated Sep. 11, 2018 for U.S. Appl. No. 15/481,618.
Notice of Allowance dated Mar. 13, 2019 for U.S. Appl. No. 15/481,618.

* cited by examiner

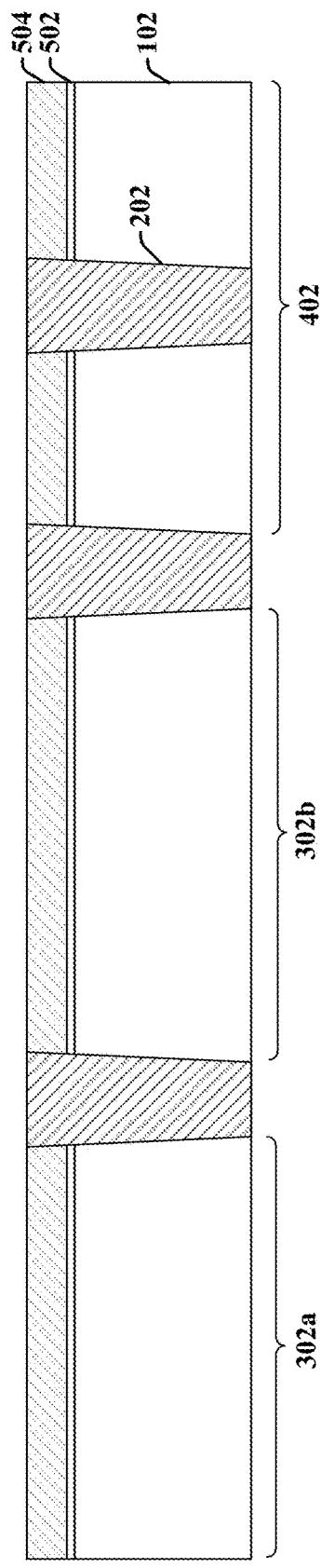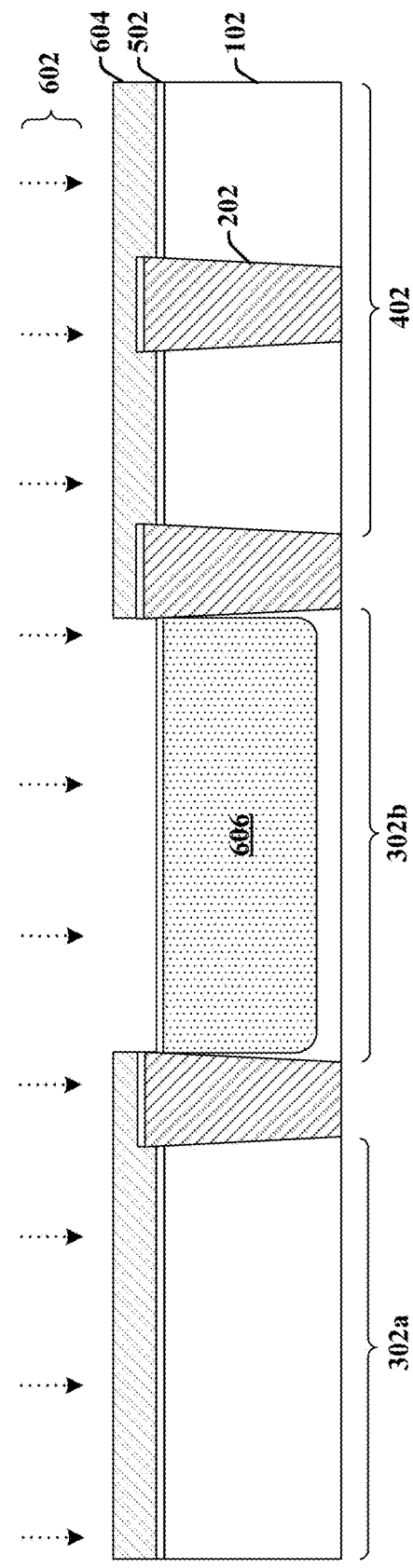

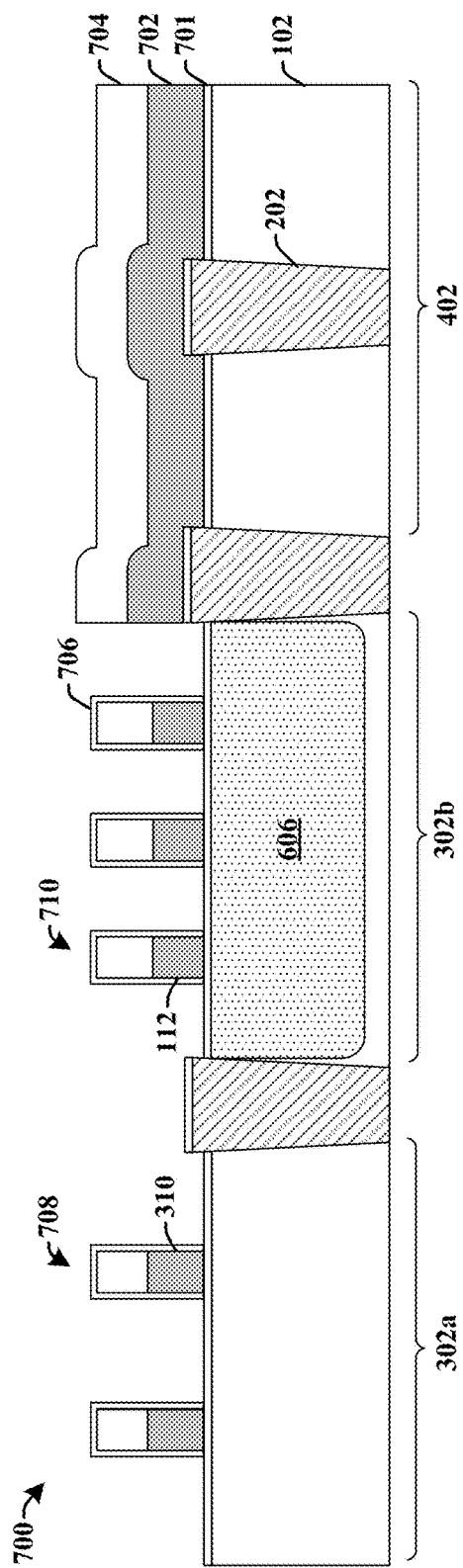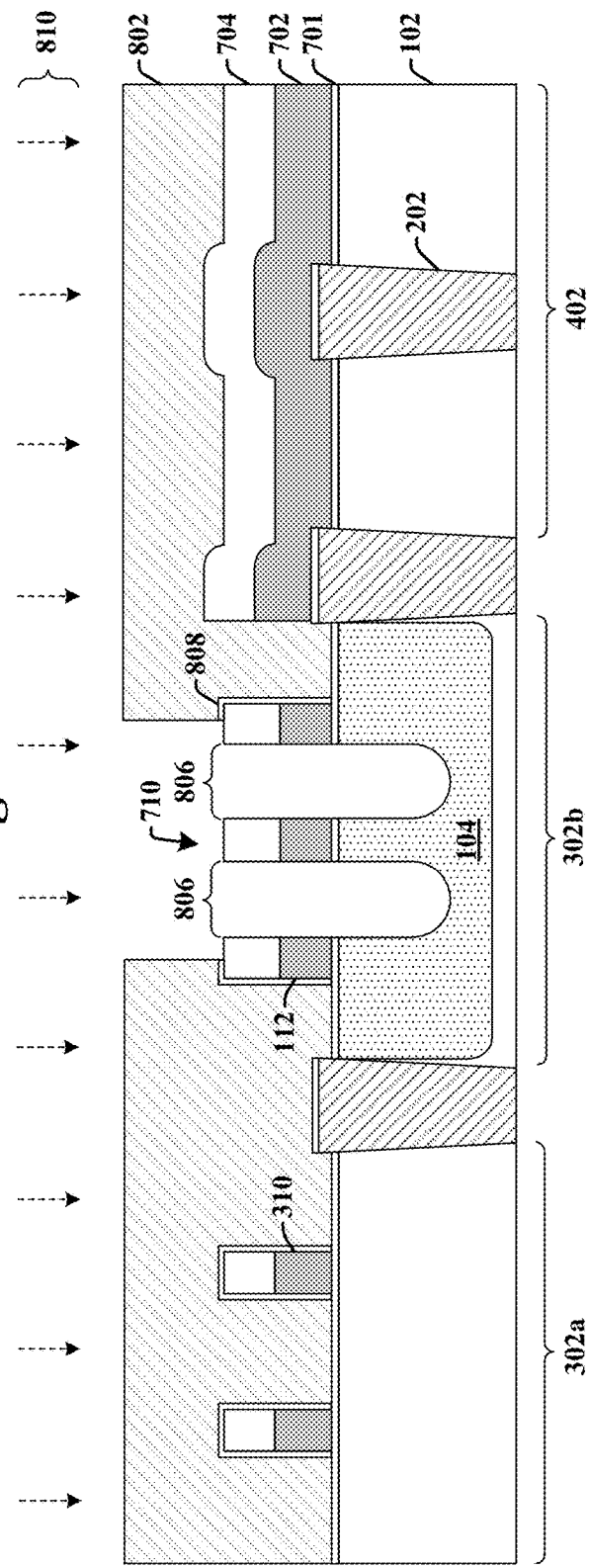

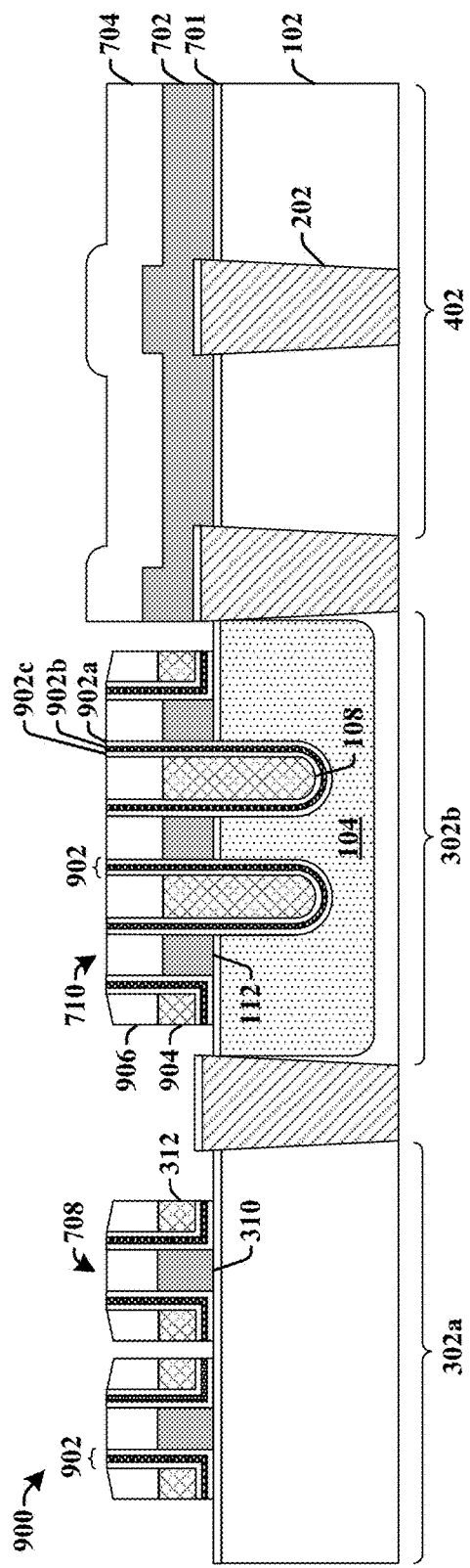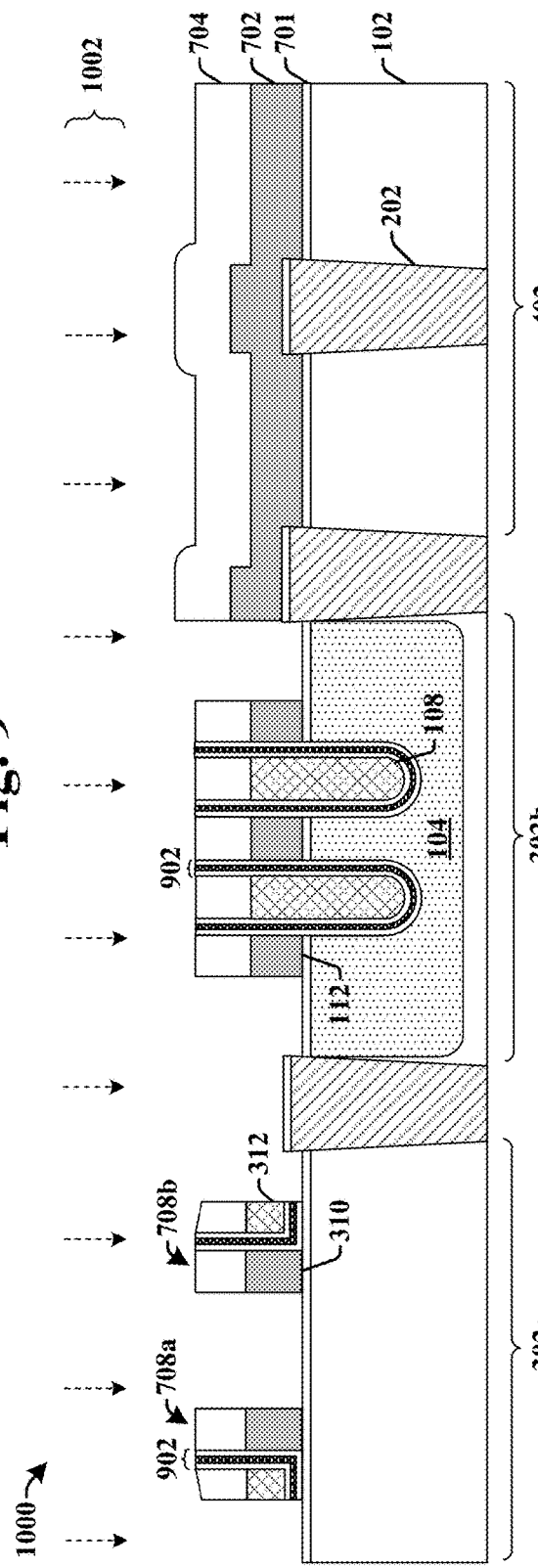

INTER-DIGITATED CAPACITOR IN SPLIT-GATE FLASH TECHNOLOGY

REFERENCE TO RELATED APPLICATIONS

This Application is a Continuation of U.S. application Ser. No. 15/481,618, filed on Apr. 7, 2017, which is a Continuation of U.S. application Ser. No. 14/865,179, filed on Sep. 25, 2015 (now U.S. Pat. No. 9,691,780, issued on Jun. 27, 2017). The contents of the above-referenced Patent Applications are hereby incorporated by reference in their entirety.

BACKGROUND

Flash memory is an electronic non-volatile computer storage medium that can be electrically erased and reprogrammed. It is used in a wide variety of electronic devices and equipment (e.g., consumer electronics, automotive, etc.). Common types of flash memory cells include stacked gate memory cells and split-gate memory cells. Split-gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-16 illustrate some embodiments of cross-sectional views showing a method of forming an integrated chip comprising a disclosed inter-digitated capacitor.

DETAILED DESCRIPTION

Figure 1:
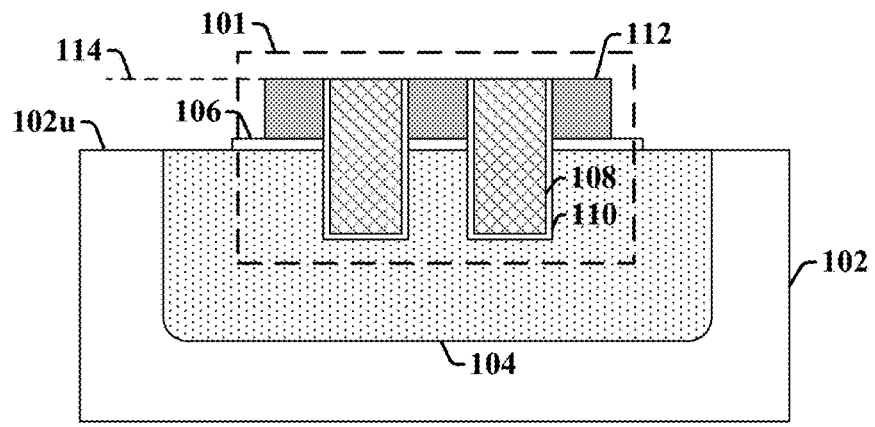
FIG. 1 illustrates some embodiments of an integrated chip comprising a disclosed inter-digitated capacitor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded memory has become common in modern day integrated chips. Embedded memory is electronic memory that is located on a same integrated chip die as logic functions (e.g., a processor or ASIC). One common type of embedded memory is embedded flash memory. Embedded flash memory cells include a select gate arranged between first and second source/drain regions of a flash memory cell. The flash memory cell also includes a control gate arranged alongside the select gate. The control gate is separated from the select gate by a charge trapping dielectric layer.

Data can be written to such a flash memory cell by applying voltages to the select gate and to the control gate. Modern day flash memory typically require high voltages (e.g., voltages greater than or equal to approximately 14 V) to implement erase and program operations. To achieve such high voltages, an integrated charge pump may be used. Integrated charge pumps use capacitors to store charge and then to release the charge to achieve a high voltage. Typically, planar capacitors, such as PIP (poly-interpoly-poly) capacitors, MIM (metal-insulator-metal), or MoM (metal-oxide-metal) capacitors are used in integrated charge pump circuits. However, the formation of such capacitors uses extra masks and extra process steps that drive a higher cost in flash technology.

In some embodiments, the present disclosure relates to an inter-digitated capacitor that can be formed along with split-gate flash memory cells and that provides for a high capacitance per unit area, and a method of formation. In some embodiments, the inter-digitated capacitor comprises a well region disposed within an upper surface of a semiconductor substrate. A plurality of trenches vertically extend from the upper surface of the semiconductor substrate to positions within the well region. Lower electrodes are arranged within the plurality of trenches. The lower electrodes are separated from the well region by a charge trapping dielectric layer arranged along inner-surfaces of the plurality of trenches. A plurality of upper electrodes are arranged over the semiconductor substrate at locations laterally separated from the lower electrodes by the charge trapping dielectric layer and vertically separated from the well region by a first dielectric layer.

FIG. 1 illustrates some embodiments of an integrated chip 100 comprising a disclosed inter-digitated capacitor 101.

The integrated chip 100 comprises a well region 104 disposed within an upper surface 102u of a semiconductor substrate 102. The well region 104 has a higher doping concentration than the semiconductor substrate 102. In some embodiments, the well region 104 may have a first doping type (e.g., n-type) while the semiconductor substrate 102 may have a second doping type (e.g., p-type) different than the first doping type. A first dielectric layer 106 is arranged over the well region 104. In some embodiments, the first dielectric layer 106 is in direct contact with an upper surface of the well region 104.

A plurality of upper electrodes 112 are arranged over the semiconductor substrate 102. The plurality of upper electrodes 112 are vertically separated from the well region 104 by the first dielectric layer 106. A plurality of lower electrodes 108 are laterally inter-leaved between the plurality of upper electrodes 112. The plurality of lower electrodes 108 vertically extend from above the upper surface 102u of the semiconductor substrate 102 to within trenches extending into the well region 104, so that the plurality of lower electrodes 108 are embedded within the well region 104.

A charge trapping dielectric layer 110 separates the plurality of lower electrodes 108 from the well region 104. The charge trapping dielectric layer 110 vertically extends from within the well region 104 to locations along sidewalls of the plurality of upper electrodes 112, so that the charge trapping dielectric layer 110 laterally separates the plurality of lower electrodes 108 from the plurality of upper electrodes 112. In some embodiments, the upper electrodes 112, the lower electrodes 108, and the charge trapping dielectric layer 110 may have planar upper surfaces that are vertically aligned (e.g., along line 114).

The plurality of lower electrodes 108 are electrically coupled together and the plurality of upper electrodes 112 are electrically coupled to the well region 104, to form a potential difference between the plurality of lower electrodes 108 and the plurality of upper electrodes 112 and the well region 104. Because the plurality of lower electrodes 108 extend to locations embedded within the well region 104, the plurality of lower electrodes achieve a high-aspect ratio (e.g., a large height to width ratio) that allows the inter-digitated capacitor 101 to provide for a high capacitance per unit area.

Figure 2:
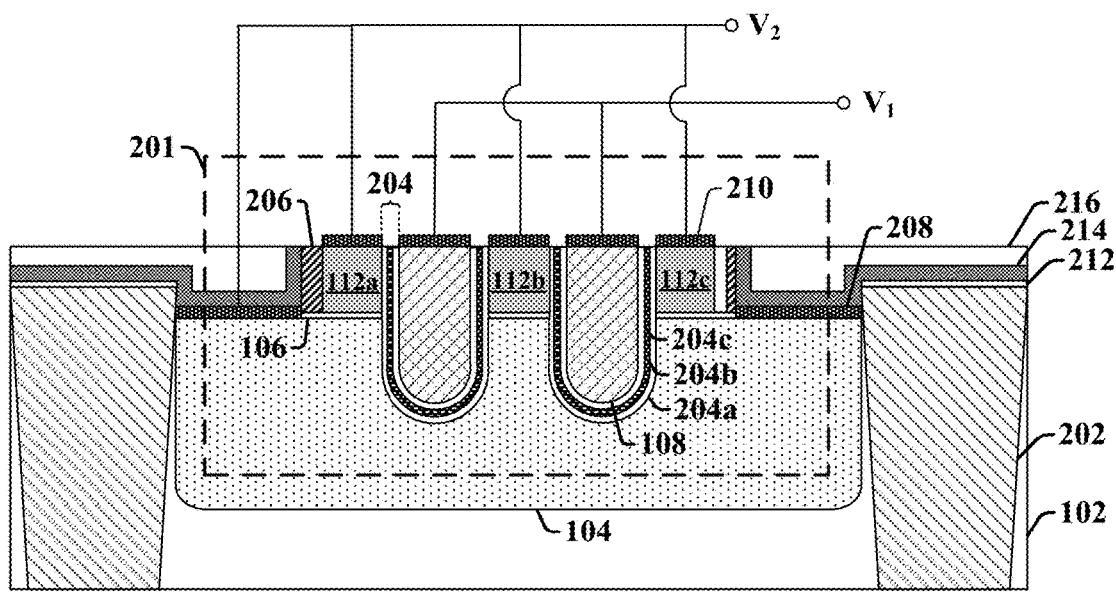
FIG. 2 illustrates some additional embodiments of an integrated chip comprising a disclosed inter-digitated capacitor.

FIG. 2 illustrates some alternative embodiments of an integrated chip 200 comprising a disclosed inter-digitated capacitor 201.

The integrated chip 200 comprises a well region 104 disposed within a semiconductor substrate 102. In some embodiments, one or more isolation structures 202 may be arranged within the semiconductor substrate 102 adjacent to the well region 104. The one or more isolation structures 202 comprise a dielectric material, such as an oxide, for example. In some embodiments, the one or more isolation structures 202 may comprise shallow trench isolation (STI) regions that protrude outward from an upper surface of the semiconductor substrate 102.

A first dielectric layer 106 is disposed onto a semiconductor substrate 102 over the well region 104. In some embodiments, the first dielectric layer 106 may comprise an oxide. A plurality of upper electrodes 112 are disposed over the first dielectric layer 106. In some embodiments, the plurality of upper electrodes 112 may be in direct contact with an upper surface of the first dielectric layer 106. A plurality of lower electrodes 108 are laterally arranged between the plurality of upper electrodes 112. The plurality of lower electrodes 108 vertically extend from between the plurality of upper electrodes 112 to locations embedded within the well region 104. In some embodiments, the plurality of lower electrodes 108 have rounded lower surfaces. In some embodiments, the plurality of upper electrodes 112 and the plurality of lower electrodes 108 may comprise a conductive material, such as doped polysilicon or a metal (e.g., aluminum), for example.

The plurality of upper electrodes 112 comprise one or more inner electrodes 112b laterally arranged between outer electrodes, 112a and 112c. In some embodiments, sidewall spacers 206 are arranged along a first sidewall of the outer electrodes, 112a and 112c. A charge trapping dielectric layer 204 is arranged along a second sidewall of the outer electrodes, 112a and 112c, and along opposing sidewalls of the one or more inner electrodes 112b, so that the charge trapping dielectric layer 204 laterally separates the plurality of upper electrodes 112 from the plurality of lower electrodes 108. The charge trapping dielectric layer 204 is also arranged along sidewalls and lower surfaces of the plurality of lower electrodes 108, so that the charge trapping dielectric layer 204 separates the plurality of lower electrodes 108 from the well region 104. In some embodiments, the plurality of upper electrodes 112, the charge trapping dielectric layer 204, the sidewall spacers 206, and the plurality of lower electrodes 108 have planar upper surfaces that are vertically aligned.

In some embodiments, the charge trapping dielectric layer 204 may comprise a tri-layer structure. In some embodiments, the tri-layer structure may comprise an ONO structure having a first oxide layer 204a, a nitride layer 204b contacting the first oxide layer 204a, and a second oxide layer 204c contacting the nitride layer 204b. In other embodiments, the tri-layer structure may comprise an oxide-nano-crystal-oxide (ONCO) structure having a first oxide layer, a plurality of quantum dots contacting the first oxide layer, and a second oxide layer contacting the first oxide layer and the plurality of quantum dots.

A lower silicide layer 208 is arranged onto the well region 104 at a location that laterally abuts the first dielectric layer 106. An upper silicide layer 210 is arranged over the plurality of lower electrodes 108 and over the plurality of upper electrodes 112. In some embodiments, the upper silicide layer 210 may comprise a plurality of segments that are spaced apart according to the charge trapping dielectric layer 204. In some embodiments, the lower silicide layer 208 and the upper silicide layer 210 comprise a nickel silicide.

In some embodiments, a contact etch stop layer 214 vertically extends along the sidewall spacers 206, and laterally extends over the lower silicide layer 208 and the isolation structures 202. A first inter-level dielectric (ILD) layer 216 is arranged over the contact etch stop layer 214. The contact etch stop layer 214 laterally separates the first ILD layer 216 from the sidewall spacers 206 and vertically separates the first ILD layer 216 from the lower silicide layer 208 and the isolation structures 202. In some embodiments, a second dielectric layer 212 may be arranged between the contact etch stop layer 214 and the isolation structures 202. In some embodiments, the second dielectric layer 212 may be a same material as the first dielectric layer 106.

The plurality of lower electrodes 108 are electrically connected to a first voltage potential $V_1$, while the plurality of upper electrodes 112 and the well region 104 are electrically connected to a second voltage potential $V_2$. A difference between the first voltage potential $V_1$ and the second voltage potential $V_2$ generates a potential difference between the plurality of lower electrodes 108 and the plurality of upper electrodes 112 and the well region 104. The potential difference generates an electric field that extends across the charge trapping dielectric layer 204. The electric field will cause charges having a first sign (e.g., positive charges) to collect on the plurality of lower electrodes 108 and charges having an opposite, second sign (e.g., negative charges) to collect on the plurality of upper electrodes 112 and the well region 104. The potential of the charges stores energy in the inter-digitated capacitor 201.

Figure 3:
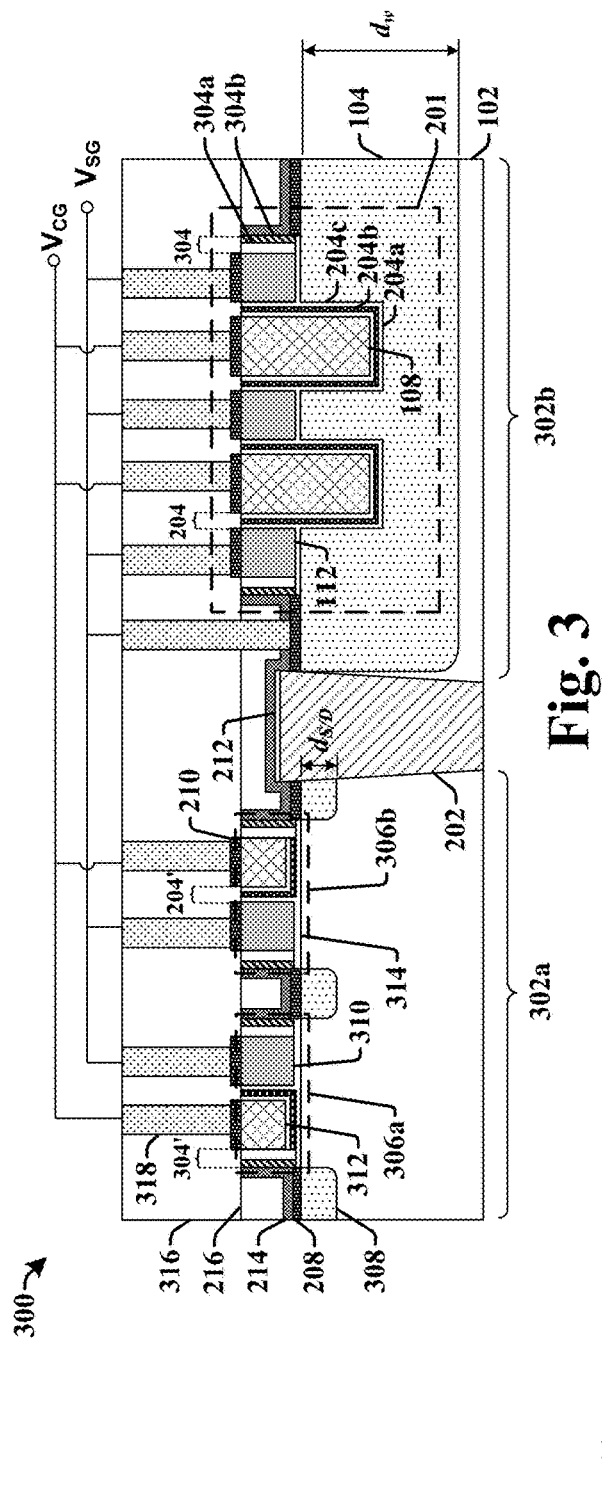
FIG. 3 illustrates some additional embodiments of an integrated chip comprising a disclosed inter-digitated capacitor and a split-gate flash memory cell.

FIG. 3 illustrates some alternative embodiments of an integrated chip 300 comprising a disclosed inter-digitated capacitor 201.

The integrated chip 300 comprises an embedded flash memory region 302a separated from a capacitor region 302b by an isolation structure 202. The capacitor region 302b comprises an inter-digitated capacitor 201 having a plurality of lower electrodes 108 laterally inter-leaved between a plurality of upper electrodes 112. The plurality of lower electrodes 108 are separated from the plurality of upper electrodes 112 and from a well region 104 by a charge trapping dielectric layer 204. Sidewall spacers 304 are disposed along outer sidewalls of the plurality of upper electrodes 112 that are arranged between the plurality of lower electrodes 108 and the isolation structures 202. In some embodiments, the sidewall spacers 304 may comprise first sidewall spacers 304a and second sidewall spacers 304b. The first sidewall spacers 304a and the second sidewall spacers 304b may comprise a nitride (e.g., SiN), for example.

The embedded flash memory region 302a comprises one or more split-gate flash memory cells 306a, 306b laterally separated from the inter-digitated capacitor 201 by the isolation structure 202. In some embodiments, the embedded flash memory region 302a comprises a pair of split-gate flash memory cells having a first split-gate flash memory cell 306a and a second split-gate flash memory cell 306b. In some embodiments, the first split-gate flash memory cell 306a and the second split-gate flash memory cell 306b are mirror images of one another about an axis of symmetry.

The split-gate flash memory cells 306a, 306b respectively comprise a control gate electrode 312 and a select gate electrode 310 laterally arranged between a plurality of source/drain regions 308 disposed within the semiconductor substrate 102. The plurality of source/drain regions 308 vertically extending within the semiconductor substrate 102 to a depth $d_{S/D}$ that is less than a depth $d_w$ of the well region 104 in the capacitor region 302b. A gate dielectric layer 314 is arranged vertically between the semiconductor substrate 102 and the control gate electrode 312. The control gate electrode 312 is laterally separated from the select gate electrode 310 by an additional charge trapping dielectric layer 204' (e.g., an ONO layer) having an 'L' shape comprising a lateral component and a vertical component. The lateral component of the additional charge trapping dielectric layer 204' vertically separates the control gate electrode 312 from the semiconductor substrate 102. In some embodiments, the lateral component of the additional charge trapping dielectric layer 204' may be separated from the semiconductor substrate 102 by the gate dielectric layer 314.

Additional sidewall spacers 304' are located along sidewalls of the control gate electrode 312 opposing the select gate electrode 310. The additional sidewall spacers 304' vertically extend from an upper surface of the control gate electrode 312 to the gate dielectric layer 314. In some embodiments, the sidewall spacers 304 may comprise a first sidewall spacer 304a and a second sidewall spacer 304b.

A lower silicide layer 208 is arranged onto the source/drain regions 308. The lower silicide layer 208 laterally abuts the gate dielectric layer 314. An upper silicide layer 210 is arranged over the control gate electrode 312 and the select gate electrode 310. In some embodiments, the contact etch stop layer 214 is laterally arranged over the lower silicide layer 208 and along the additional sidewall spacers 304', while a first inter-level dielectric (ILD) layer 216 is arranged onto the contact etch stop layer 214. In some embodiments, the first ILD layer 216 may comprise a low-k dielectric layer, an ultra low-k dielectric layer, an extreme low-k dielectric layer, and/or a silicon dioxide layer. In some embodiments, the first ILD layer 216 has a planar upper surface that underlies the upper silicide layer 210. In some embodiments, the planar upper surface of the first ILD layer 216 is vertically aligned with upper surfaces of the plurality of lower electrodes 108, the plurality of upper electrodes 112, the control gate electrode 312 and the select gate electrode 310.

A second inter-layer dielectric (ILD) layer 316 is located over the first ILD layer 216. In some embodiments, the second ILD layer 316 may comprise a low-k dielectric layer, an ultra low-k dielectric layer, an extreme low-k dielectric layer, and/or a silicon dioxide layer. A plurality of contacts 318 comprising a conductive material extend vertically through the second ILD layer 316 to abut lower silicide layer 208 and the upper silicide layer 610. In some embodiments, the plurality of contacts 318 may comprise a metal such as tungsten, copper, and/or aluminum.

Figure 4:
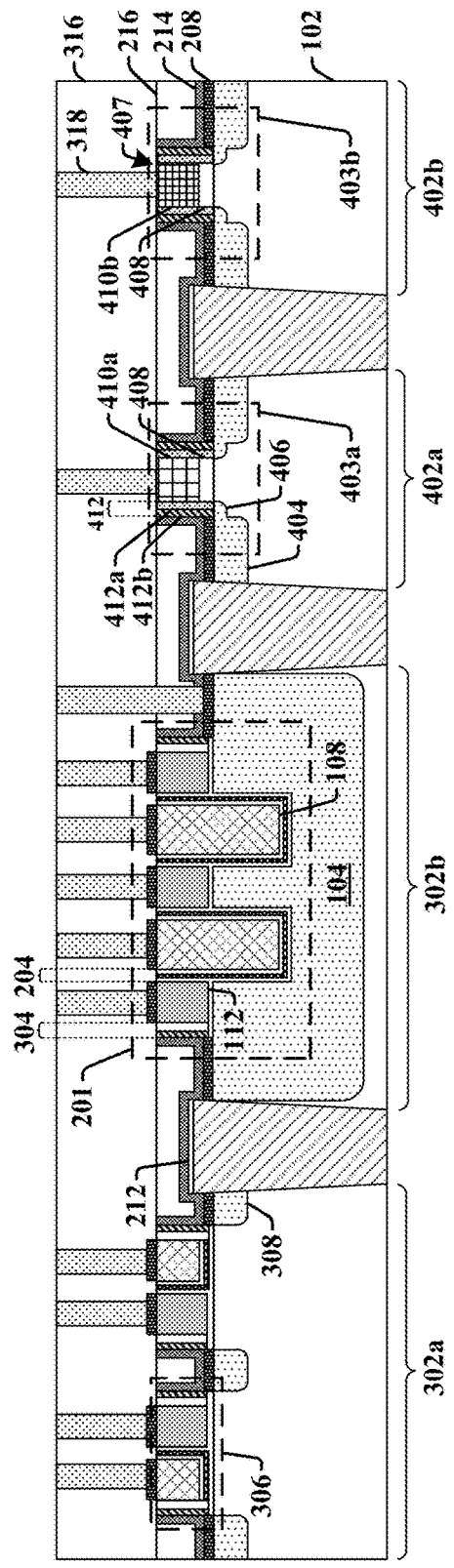
FIG. 4 illustrates some alternative embodiments of an integrated chip comprising a disclosed inter-digitated capacitor, a split-gate flash memory cell, and a logic device.

FIG. 4 illustrates some alternative embodiments of an integrated chip 400 comprising a disclosed inter-digitated capacitor 201.

The integrated chip 400 comprises a capacitor region 302b arranged between an embedded flash memory region 302a and a logic region 402. The capacitor region 302b is separated from the embedded flash memory region 302a and from the logic region 402 by one or more isolation structures 202 arranged within a semiconductor substrate 102. The embedded flash memory region 302a comprises a plurality of split-gate flash memory cells 306 described above. The capacitor region 302b comprises an inter-digitated capacitor 201 described above.

The logic region 402 comprises a plurality of transistor devices 403a, 403b. The plurality of transistor devices 403a, 403b respectively comprise a gate structure 407 laterally arranged between source/drain regions 404 located within the semiconductor substrate 102. Sidewall spacers 412 are arranged onto opposing sides of the gate structure 407. In some embodiments, the sidewall spacers 412 may comprise first sidewall spacers 412a and second sidewall spacers 412b. In some embodiments, drain extensions regions 406 that are arranged within the semiconductor substrate 102 may protrude outward from the source/drain regions 404 to under the sidewall spacers 412.

In some embodiments, the logic region 402 may comprise an NMOS region 402a having an NMOS transistor device 403a and/or a PMOS region 402b having a PMOS transistor device 403b. In some embodiments, the NMOS transistor device 403a comprises a high-k metal gate transistor having a high-k gate dielectric layer 408 and an overlying NMOS metal gate electrode 410a. In some embodiments, the PMOS transistor device 403b comprises a high-k metal gate transistor having a high-k gate dielectric layer 408 and an overlying PMOS metal gate electrode 410b. The NMOS metal gate electrode 410a has a different work function than the PMOS metal gate electrode 410b. In some embodiments, the high-k gate dielectric layer 408 may comprise hafnium oxide (HfO), hafnium silicon oxide (HfSiO), hafnium aluminum oxide (HfAlO), or hafnium tantalum oxide (HMO), for example. In some embodiments (not shown), the high-k dielectric gate layer 408 may comprise a bottom high temperature oxide layer and an overlying high-k dielectric layer.

FIGS. 5-16 illustrate some embodiments of cross-sectional views 500-1600 showing a method of forming an integrated chip having an inter-digitated capacitor.

As shown in cross-sectional view 500 of FIG. 5, a semiconductor substrate 102 is provided. In various embodiments, the semiconductor substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

A first dielectric layer 502 (e.g., $SiO_2$) is formed over the semiconductor substrate 102. In some embodiments, the first dielectric layer 502 comprises an oxide (e.g., $SiO_2$) formed by way of a thermal process or by a deposition process (e.g., chemical vapor deposition (CVD), physical vapor deposition (PVD), atomic layer deposition (ALD), etc.). A first masking layer 504 is formed over the first dielectric layer 502. In some embodiments, the first masking layer 504 may comprise a silicon nitride layer. The semiconductor substrate 102 is selectively etched according to the first masking layer 504 to form isolation trenches, which are subsequently filled with an insulating material to form one or more isolation structures 202 within the semiconductor substrate 102. The isolation structures 202 laterally separate an embedded flash memory region 302a, a capacitor region 302b, and a logic region 402.

As shown in cross-sectional view 600 of FIG. 6, a first implantation process is performed. The first implantation process selectively implants a first dopant species 602 (e.g., boron, phosphorous, etc.) into the semiconductor substrate 102 according to a second masking layer 604. In some embodiments, the second masking layer 604 may comprise the first dielectric layer 504. In other embodiments, the second masking layer 604 may comprise a photoresist layer. The first dopant species 602 form a well region 606 within the semiconductor substrate 102. In some embodiments, after the first implantation process is finished, the dopant species 602 may be driven into the semiconductor substrate 102 by exposing the semiconductor substrate 102 to an elevated temperature. After the well region 606 is formed, the first dielectric layer 502 may be removed.

As shown in cross-sectional view 700 of FIG. 7, a second dielectric layer 701 (e.g., an oxide) is formed over the semiconductor substrate 102. The first electrode layer 702 is formed over the second dielectric layer 701 and a hard mask layer 704 is formed over the first electrode layer 702. In some embodiments, the first electrode layer 702 may comprise doped polysilicon. In some embodiments, the hard mask layer 704 may comprise silicon nitride (SiN).

The first electrode layer 702 and the hard mask layer 704 are subsequently patterned to define a plurality of select gate stacks 708 and a plurality of upper electrode stacks 710. In some embodiments, the hard mask layer 704 may be patterned according to a photolithography process. In such embodiments, the first electrode layer 702 is selectively exposed to an etchant in areas not masked by the hard mask layer 704 to form the plurality of select gate stacks 708 and the plurality of upper electrode stacks 710.

The plurality of select gate stacks 708 respectively comprise a select gate electrode 310 and an overlying hard mask layer 704. The plurality of upper electrode stacks 710 respectively comprise an upper electrode 112 an overlying hard mask layer 704. After patterning, an oxide layer 706 may be grown onto outer surfaces of the plurality of select gate stacks 708 and the plurality of upper electrode stacks 710. In some embodiments, the oxide layer 706 may be grown by way of a deposition process (e.g., CVD, PVD, ALD, etc.). The oxide layer 706 is configured to protect the plurality of upper electrode stacks 710 during subsequent etching processes.

As shown in cross-sectional view 800 of FIG. 8, a third masking layer 802 is formed over the semiconductor substrate 102. In some embodiments, the third masking layer 802 may comprise a photoresist layer. After the third masking layer 802 is formed, a first etching process is performed. The first etching process exposes the well region 104 to a first etchant 810 configured to etch the second dielectric layer 701 and the well region 104, to form a plurality of trenches 806 extending into the well region 104 between the upper electrodes 112.

As shown in cross-sectional view 900 of FIG. 9, a charge trapping dielectric layer 902 is formed. Within the embedded flash memory region 302a, the charge trapping dielectric layer 902 is formed on opposing sides of the select gate stacks 708. In some embodiments, the charge trapping dielectric layer 902 within the embedded flash memory region 302a may have an 'L' shape with a lateral segment in direct contact with the second dielectric layer 701. Within the capacitor region 302b, the charge trapping dielectric layer 902 is formed on opposing sides of the plurality of upper electrode stacks 710. In some embodiments, the charge trapping dielectric layer 902 may have an 'L' shape between an upper electrode stacks 710 and the isolation structures 202 and a 'U' shape between adjacent upper electrode stacks 710. The charge trapping dielectric layer 902 lines the interior surfaces of the plurality of trenches 806.

A second electrode layer 904 is formed onto lateral surfaces of the charge trapping dielectric layer 902. Within the embedded flash memory region 302a, the second electrode layer 904 forms control gate electrodes 312. Within the capacitor region 302b, the second electrode layer 904 forms lower electrodes 108 extending into the plurality of trenches 806. In some embodiments, the second electrode layer 904 may comprise doped polysilicon or metal formed by a deposition process (e.g., CVD, PVD, ALD, etc.). A hard mask layer 906 may be formed over the second electrode layer 904.

As shown in cross-sectional view 1000 of FIG. 10, a second etching process is performed. The second etching process selectively exposes the charge trapping dielectric layer 902, the second electrode layer 904, and hard mask layer 906 to a second etchant 1002. Within the embedded flash memory region 302a, the second etchant 1002 removes the charge trapping dielectric layer 902, the second electrode layer 904, and the hard mask layer 906 between a first control gate stack 708a and a second control gate stack 708b. Within the capacitor region 302b, the second etchant 1002 removes the charge trapping dielectric layer 902, the second electrode layer 904, and hard mask layer 906 between the upper electrodes 112 and the isolation structures 202. In various embodiments, the second etchant 1002 comprises a dry etch (e.g., a plasma etch with tetrafluoromethane ($CF_4$), sulfur hexafluoride ($SF_6$), nitrogen trifluoride ($NF_3$), etc.).

Figure 11:
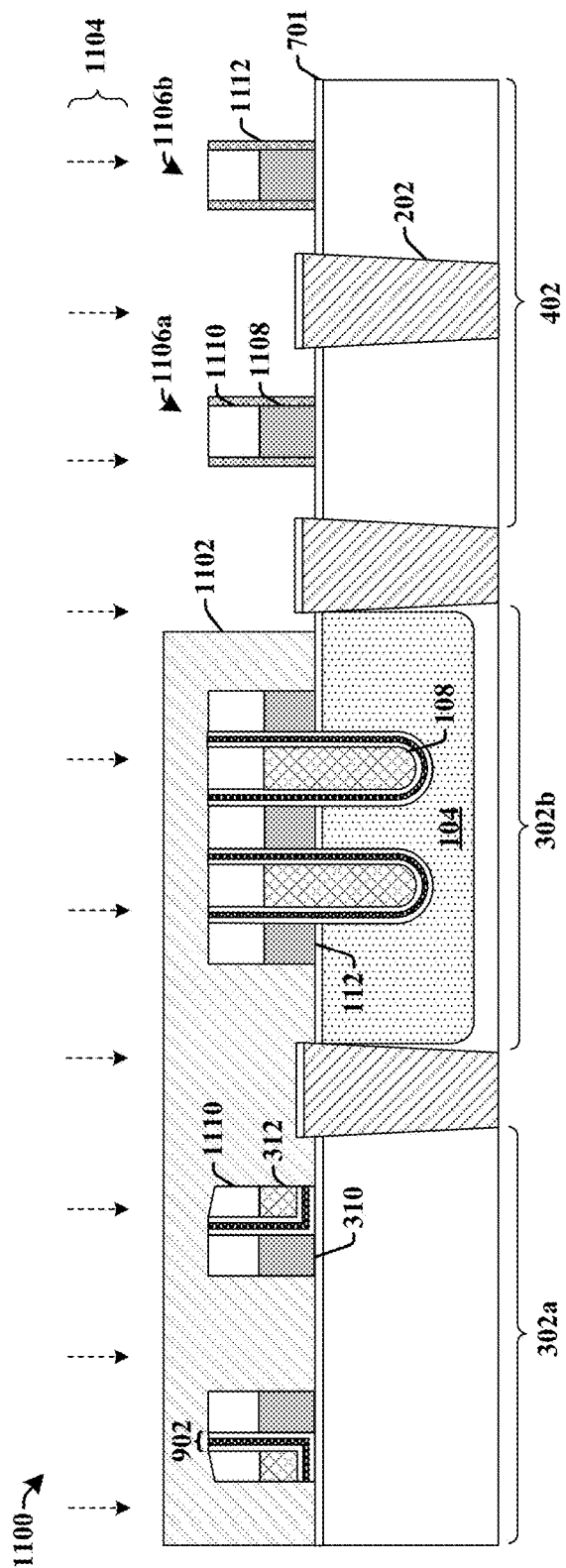

As shown in cross-sectional view 1100 of FIG. 11, a fourth masking structure 1102 is formed over the semiconductor substrate 102 in the embedded flash memory region 302a and in the capacitor region 302b. In some embodiments, the fourth masking structure 1102 may comprise a BARC (bottom anti-reflective coating) formed over the semiconductor substrate 102 through a spin-coating or other appropriate technique. In other embodiments, the fourth masking structure 1102 may comprise a photoresist layer.

After the fourth masking structure 1102 is formed, a third etching process is performed. The third etching process selectively exposes the first electrode layer (702 of FIG. 10) and the hard mask layer (704 of FIG. 10) to a third etchant 1104. The third etchant 1104 is configured to selectively remove parts of the first electrode layer (702 of FIG. 10) and the hard mask layer (704 of FIG. 10) within the logic region 402 to define sacrificial gate stacks, 1106a and 1106b. The sacrificial gate stacks, 1106a and 1106b, respectively comprise a sacrificial polysilicon layer 1108 and an overlying sacrificial hard mask layer 1110. A first sidewall spacer layer 1112 may be formed along sidewalls of the sacrificial gate stacks, 1106a and 1106b. In some embodiments, the first sidewall spacer layer 1112 may comprise an oxide (e.g., $SiO_2$) or a nitride (e.g., SiN) formed by a deposition process.

Figure 12:
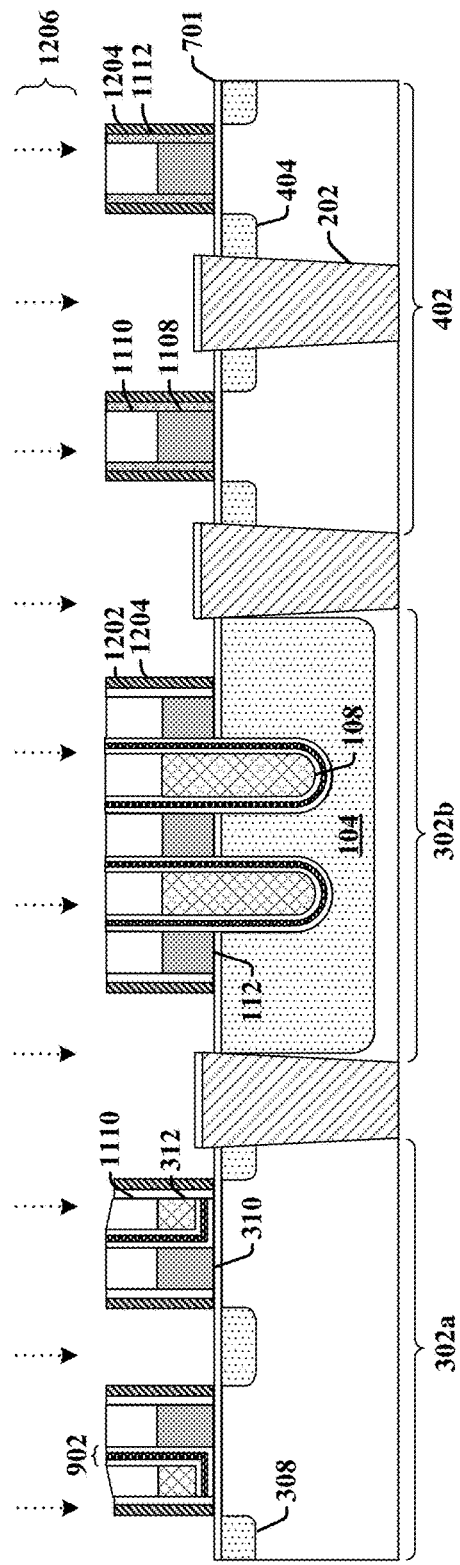

As shown in cross-sectional view 1200 of FIG. 12, a second sidewall spacer layer 1202 may be formed along sidewalls of the select gate stacks 708 and the upper electrode stacks 710. A third sidewall spacer layer 1204 may be subsequently formed along sidewalls of the select gate stacks 708, the upper electrode stacks 710, and the sacrificial gate stacks, 1106a and 1106b. In some embodiments, the second sidewall spacer layer 1202 and the third sidewall spacer layer 1204 may comprise an oxide (e.g., $SiO_2$) or a nitride (e.g., SiN) formed by a deposition process.

Source/drain regions, 308 and 404, are subsequently formed within the embedded flash memory region 302a and within the logic region 402, respectively. The source/drain regions, 308 and 404, may be formed by a second implantation process that selectively implants the semiconductor substrate 102 with a dopant species 1206, such as boron (B) or phosphorous (P), for example. The dopant species 1206 may be subsequently driven into the semiconductor substrate 102. The source and drain regions, 308 and 404, extend into the semiconductor substrate 102 to a depth that is less than a depth of the well region 104.

Figure 13:
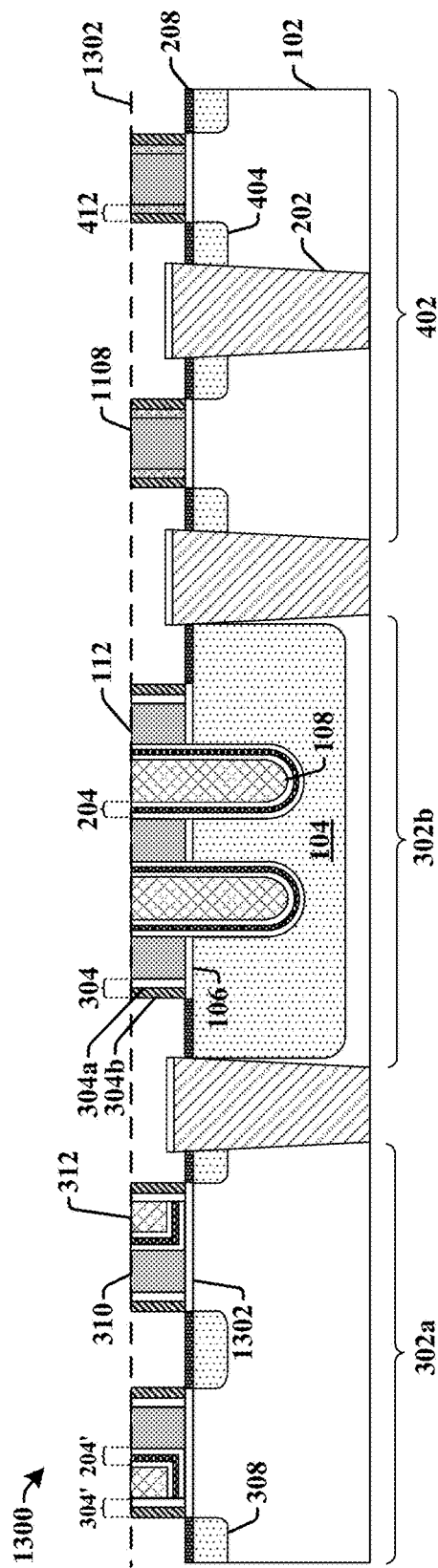

As shown in cross-sectional view 1300 of FIG. 13, a first salicidation process is performed to form a lower silicide layer 208 on upper surfaces of the well region 104 and the source/drain regions, 308 and 404. In some embodiments, the first salicidation process may be performed by depositing a nickel layer and then performing a thermal annealing process (e.g., a rapid thermal anneal) to form a lower silicide layer 208 comprising nickel.

A first planarization process is then performed along line 1302. The first planarization process removes the hard mask layer and the charge trapping layer from locations vertically overlying control gate electrodes 312, the upper electrodes 112, and the sacrificial polysilicon layer 1108. In some embodiments, the first planarization process may comprise a chemical mechanical polishing (CMP) process.

Figure 14:
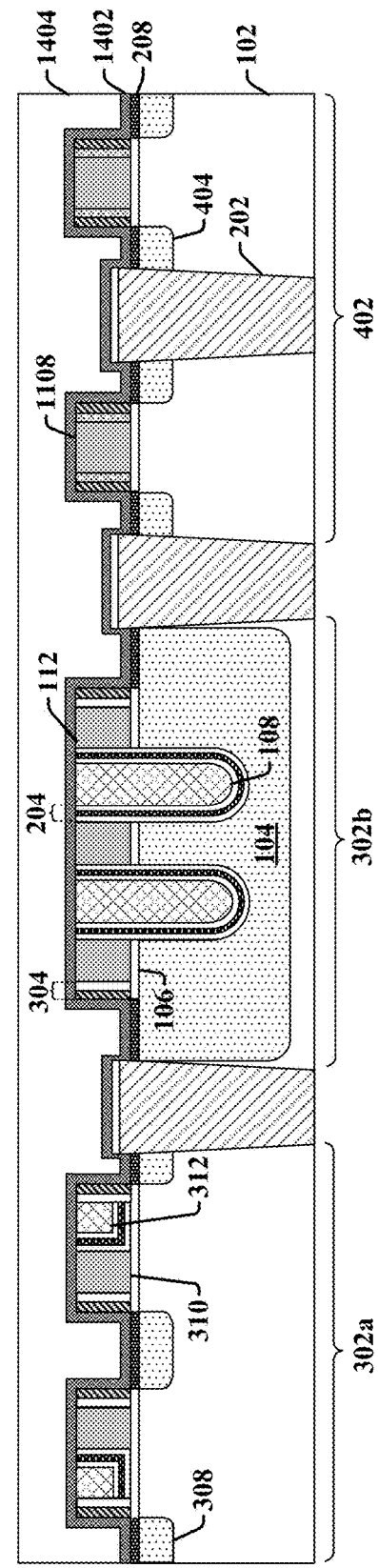

As shown in cross-sectional view 1400 of FIG. 14, a contact etch stop layer 1402 is formed over the semiconductor substrate 102, and a first inter-level dielectric (ILD) layer 1404 is formed onto the contact etch stop layer 1402. In some embodiments, the contact etch stop layer 1402 may comprise silicon nitride formed by way of a deposition process (e.g., CVD, PVD, etc.). In some embodiments, the first ILD layer 1404 may comprise a low-k dielectric layer, formed by way of a deposition process (e.g., CVD, PVD, etc.).

Figure 15:
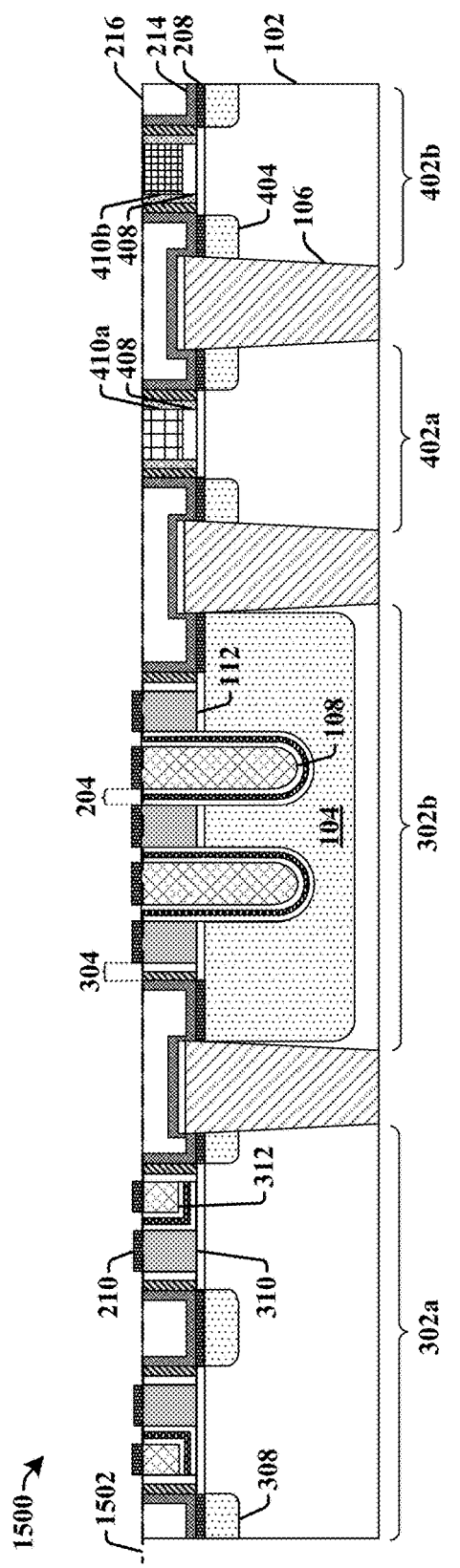

As shown in cross-sectional view 1500 of FIG. 15, a second planarization process is performed along line 1502. The second planarization process removes parts of the contact etch stop layer 214 and the first ILD layer 216 from locations vertically overlying control gate electrodes 312, the upper electrodes 112, and the sacrificial polysilicon layer (1108 of FIG. 14). In some embodiments, the second planarization process may comprise a chemical mechanical polishing (CMP) process, for example.

A replacement gate process is subsequently performed. The replacement gate process removes the sacrificial polysilicon layer and forms a high-k gate dielectric layer 408 at a position replacing the sacrificial polysilicon layer using a deposition technique (e.g., chemical vapor deposition, physical vapor deposition, etc.). A metal gate electrode 410 is deposited over the high-k gate dielectric layer 408 using a deposition technique. In some embodiments, an NMOS metal gate electrode 410a may be formed over the high-k gate dielectric layer 410 to form a NMOS transistor device within an NMOS region 402a. In some embodiments, a PMOS metal gate electrode 410b may be formed over the high-k gate dielectric layer 410 to form a PMOS transistor device within a PMOS region 402b. The NMOS metal gate electrode 410a has a different work function than the PMOS metal gate electrode 410b.

A second salicidation process is then performed to form an upper silicide layer 210 on an upper surfaces of the control gate electrodes 312, the select gate electrodes 310, the upper electrodes 112, and the lower electrodes 108. In some embodiments, the second salicidation process may be performed by depositing a nickel layer and then performing a thermal annealing process (e.g., a rapid thermal anneal) to form an upper silicide layer 210 comprising nickel.

Figure 16:
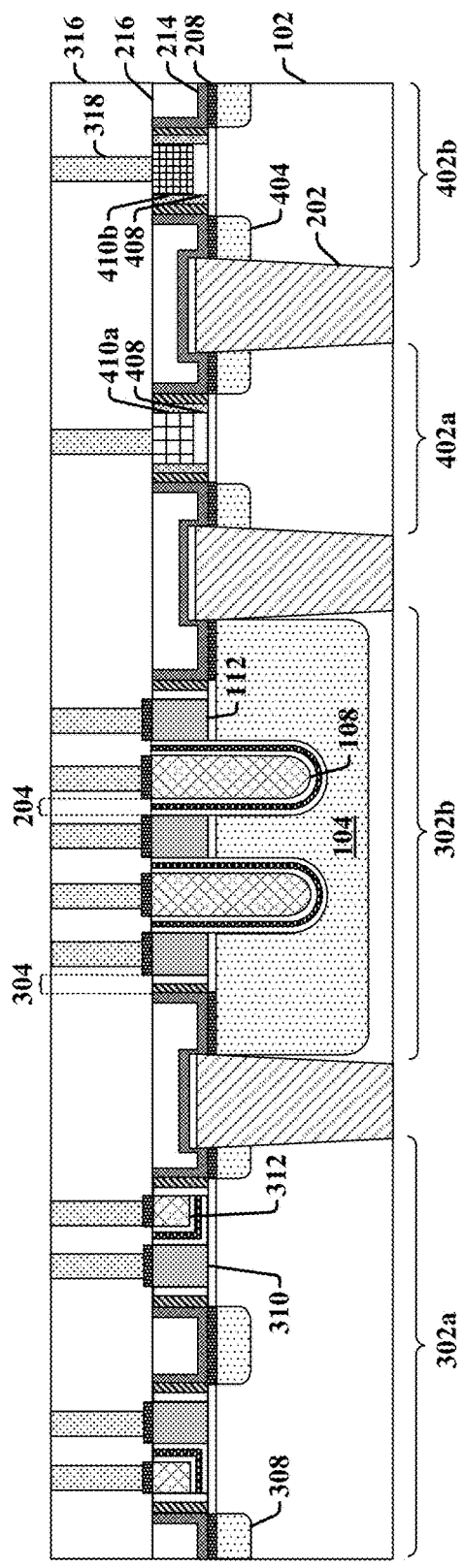

As shown in cross-sectional view 1600 of FIG. 16, contacts 318 are formed within a second inter-layer dielectric (ILD) layer 316 overlying the first ILD layer 216. The contacts 318 may be formed by selectively etching the second ILD layer 316 to form openings, and by subsequently depositing a conductive material within the openings. In some embodiments, the conductive material may comprise tungsten (W) or titanium nitride (TiN), for example.

Figure 17:
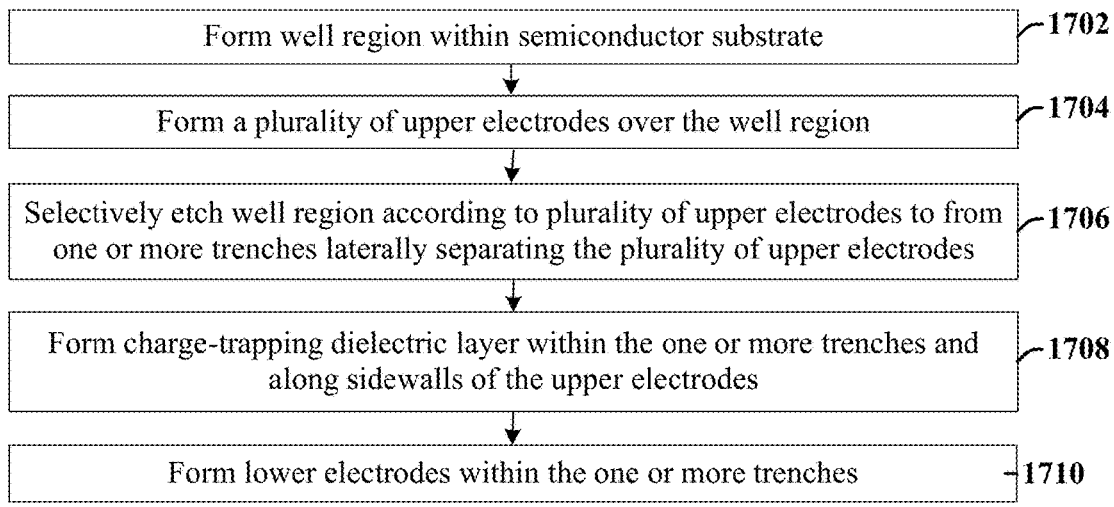
FIG. 17 illustrates some embodiments of a method of forming an integrated chip comprising a disclosed inter-digitated capacitor.

FIG. 17 illustrates a flow diagram of some embodiments of a method 1700 of forming an integrated chip having an integrated chip having an inter-digitated capacitor.

While the disclosed methods (e.g., methods 1700 and 1800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a well region is formed within a semiconductor substrate.

At 1704, a plurality of upper electrodes are formed over the well region.

At 1706, the well region is selectively etched according to the plurality of upper electrodes to from one or more trenches laterally separating the plurality of upper electrodes.

At 1708, a charge-trapping dielectric layer is formed within the one or more trenches and along sidewalls of the upper electrodes.

At 1710, lower electrodes are formed within the one or more trenches. The lower electrodes are separated from the well region and from the upper electrodes by the charge-trapping dielectric layer.

Figure 18:
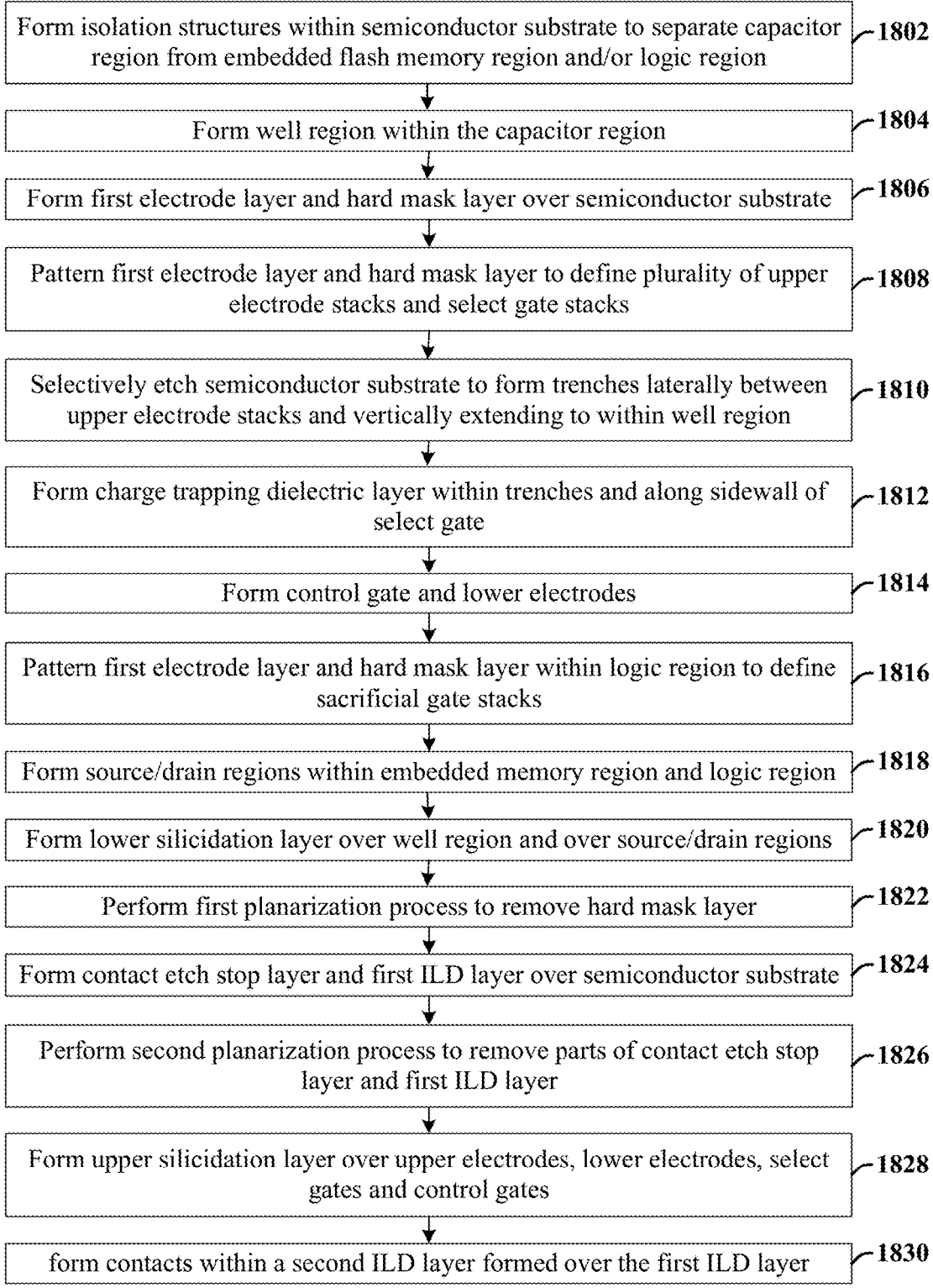
FIG. 18 illustrates some additional embodiments of a method of forming an integrated chip comprising a disclosed inter-digitated capacitor.

FIG. 18 illustrates a flow diagram of some additional embodiments of a method 1800 of forming an integrated chip having an integrated chip having an inter-digitated capacitor. Although method 1800 is described in relation to FIGS. 5-16, it will be appreciated that the method 1800 is not limited to such structures, but instead may stand alone as a method independent of the structures.

At 1802, isolation structures are formed within a semiconductor substrate to separate a capacitor region from an embedded flash memory region and a logic region. FIG. 5 illustrates some embodiments of a cross-sectional view 500 corresponding to act 1802.

At 1804, a well region is formed within the capacitor region. FIG. 6 illustrates some embodiments of a cross-sectional view 600 corresponding to act 1804.

At 1806, a first electrode layer and a hard mask layer are formed over the semiconductor substrate. FIG. 7 illustrates some embodiments of a cross-sectional view 700 corresponding to act 1806.

At 1808, the first electrode layer and the hard mask layer are patterned to define a plurality of upper electrode stacks within the embedded flash memory region and select gate stacks within the embedded flash memory region. The plurality of upper electrode stacks comprise upper electrodes and an overlying hard mask layer. The plurality of select gate stacks comprise a select gate electrode and an overlying hard mask layer. FIG. 7 illustrates some embodiments of a cross-sectional view 700 corresponding to act 1808.

At 1810, the semiconductor substrate is selectively within capacitor region to form one or more trenches. The one or more trenches are laterally between the plurality of upper electrode stacks and vertically extend to within the well region. FIG. 8 illustrates some embodiments of a cross-sectional view 800 corresponding to act 1810.

At 1812, a charge trapping dielectric layer is formed within the one or more trenches and along sidewall of select gate stacks and the upper electrode stacks. FIG. 9 illustrates some embodiments of a cross-sectional view 900 corresponding to act 1812.

At 1814, control gates and lower electrodes are formed. The control gates are formed at locations separated from the select gates and the upper electrodes are formed within the one or more trenches. FIGS. 9-10 illustrate some embodiments of a cross-sectional view 900 corresponding to act 1814.

At 1816, the first electrode layer and the hard mask layer are patterned within the logic region to define sacrificial gate stacks. The sacrificial gate stacks comprise a select gate electrode and an overlying hard mask layer. FIG. 11 illustrates some embodiments of a cross-sectional view 1100 corresponding to act 1816.

At 1818, source/drain regions are formed within the embedded flash memory region and the logic region. FIG. 12 illustrates some embodiments of a cross-sectional view 1200 corresponding to act 1818.

At 1820, a lower silicidation layer is formed over the well region and over the source/drain regions. FIG. 13 illustrates some embodiments of a cross-sectional view 1300 corresponding to act 1820.

At 1822, a first planarization process is performed to remove the hard mask layer. FIG. 13 illustrates some embodiments of a cross-sectional view 1300 corresponding to act 1822.

At 1824, a contact etch stop layer and a first inter-level dielectric (ILD) layer are formed over the semiconductor substrate. FIG. 14 illustrates some embodiments of a cross-sectional view 1400 corresponding to act 1822.

At 1826, a second planarization process is performed to remove parts of contact etch stop layer and first ILD layer. FIG. 15 illustrates some embodiments of a cross-sectional view 1500 corresponding to act 1826.

At 1828, an upper silicidation layer is formed over the lower electrodes, the select gates, and the control gates. FIG. 15 illustrates some embodiments of a cross-sectional view 1500 corresponding to act 1828.

At 1830, contacts are formed within a second inter-level dielectric (ILD) layer formed over the first ILD layer. FIG. 16 illustrates some embodiments of a cross-sectional view 1500 corresponding to act 1830.

Therefore, the present disclosure relates to an integrated chip having an inter-digitated capacitor that can be formed along with split-gate flash memory cells and that provides for a high capacitance per unit area, and an associated method of formation.

In some embodiments, the present disclosure relates to an integrated chip. The integrated chip comprises a plurality of upper electrodes separated from a substrate by a first dielectric layer. A plurality of lower electrodes vertically extend from between the plurality of upper electrodes to locations embedded within the substrate. A charge trapping dielectric layer is arranged between the substrate and the plurality of lower electrodes and between the plurality of upper electrodes and the plurality of lower electrodes. The charge trapping dielectric layer comprises a plurality of discrete segments respectively lining opposing sidewalls and a lower surface of one of the plurality of lower electrodes.

In other embodiments, the present disclosure relates to an inter-digitated capacitor. The inter-digitated capacitor comprises a plurality of upper electrodes arranged over and separated from a substrate by a first dielectric layer. A lower electrode is interleaved between the plurality of upper electrodes and is arranged within trenches extending into the substrate. The lower electrode has a substantially flat upper surface facing away from the substrate. A charge trapping dielectric layer separates the lower electrode from the substrate and from the plurality of upper electrodes. The charge trapping dielectric layer has outermost sidewalls arranged between the plurality of upper electrodes.

In yet other embodiments, the present disclosure relates to a method of forming an integrated chip. The method comprises forming a plurality of upper electrodes over a substrate. The method further comprises selectively etching the substrate according to a masking layer arranged over the plurality of upper electrodes to form a trench that extends into the substrate and laterally separates the plurality of upper electrodes. The method further comprises forming a charge trapping dielectric layer within the trench and along sidewalls of the plurality of upper electrodes. The method further comprises forming a lower electrode on the charge trapping dielectric layer and within the trench. The lower electrode comprises a conductive material that continuously extends between opposing sidewalls of the trench and that is recessed below a top surface of the masking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a plurality of upper electrodes separated from a semiconductor substrate by a first dielectric layer;
a lower electrode laterally disposed between the plurality of upper electrodes and between sidewalls of the semiconductor substrate;
a second dielectric layer lining opposing sidewalls and a lower surface of the lower electrode, wherein the second dielectric layer laterally separates the lower electrode from the plurality of upper electrodes and from the sidewalls of the semiconductor substrate; and
wherein the lower electrode has a bottommost surface that is above the semiconductor substrate and vertically below bottommost surfaces of the upper electrodes.

2. The integrated chip of claim 1, wherein the lower electrode continuously extends between the opposing sidewalls of the lower electrode.

3. The integrated chip of claim 1, wherein the second dielectric layer is a charge trapping dielectric layer.

4. The integrated chip of claim 1, wherein the lower electrode has an upper surface that continuously extends between sidewalls of the second dielectric layer.

5. The integrated chip of claim 1, further comprising:
one or more sidewall spacers laterally separated from opposing sides of the lower electrode by the plurality of upper electrodes, wherein the one or more sidewall spacers have one or more upper surfaces that are arranged along a horizontal plane; and
wherein the lower electrode vertically extends from directly between the sidewalls of the semiconductor substrate to the horizontal plane.

6. The integrated chip of claim 1, wherein the lower electrode is symmetric about a vertical line bisecting an upper surface of the lower electrode.

7. The integrated chip of claim 1, wherein the plurality of upper electrodes and the lower electrode comprise polysilicon.

8. The integrated chip of claim 1, wherein the second dielectric layer continuously extends between the sidewalls of the semiconductor substrate.

9. An integrated chip, comprising:
a plurality of upper electrodes separated from a semiconductor substrate by a first dielectric layer;
a lower electrode laterally disposed between the plurality of upper electrodes and between first sidewalls of the semiconductor substrate;
a second dielectric layer separating the lower electrode from the plurality of upper electrodes and from the first sidewalls of the semiconductor substrate, wherein the second dielectric layer continuously extends between the first sidewalls of the semiconductor substrate; and
one or more isolation structures laterally surrounding the plurality of upper electrodes, wherein the one or more isolation structures comprise one or more dielectric materials disposed directly between second sidewalls of the semiconductor substrate.

10. The integrated chip of claim 9, wherein the first dielectric layer has a substantially constant thickness between the semiconductor substrate and the plurality of upper electrodes.

11. The integrated chip of claim 9, wherein a horizontal line extending along a bottom of the lower electrode extends through the second sidewalls of the semiconductor substrate.

12. The integrated chip of claim 9, further comprising:
a silicide layer disposed on the semiconductor substrate laterally between outermost sidewalls of the plurality of upper electrodes and the one or more isolation structures.

13. An integrated chip, comprising:
a plurality of upper electrodes disposed over a substrate;
a lower electrode vertically extending from between the plurality of upper electrodes to within the substrate;
a second dielectric layer arranged between the substrate and the lower electrode and between the plurality of upper electrodes and the lower electrode;
wherein the lower electrode has a rounded lower surface facing the substrate; and
a silicide disposed over the lower electrode and the plurality of upper electrodes, wherein the silicide has sidewalls that are laterally separated by a distance directly overlying a top of the second dielectric layer.

14. The integrated chip of claim 13, further comprising:
a first dielectric layer disposed between the substrate and the plurality of upper electrodes.

15. The integrated chip of claim 14, further comprising:
one or more sidewall spacers laterally separated from opposing sides of the lower electrode by the plurality of upper electrodes, wherein the first dielectric layer extends from directly below the plurality of upper electrodes to directly below the one or more sidewall spacers.

16. The integrated chip of claim 13, wherein the second dielectric layer lines sidewalls and the rounded lower surface of the lower electrode.

17. The integrated chip of claim 13, further comprising:
one or more isolation structures comprising a dielectric disposed within the substrate and laterally separated from the second dielectric layer by the substrate; and
an additional silicide disposed on the substrate laterally between outermost sidewalls of the upper electrodes and the one or more isolation structures.

18. The integrated chip of claim 1, wherein the lower electrode has a greater height at a lateral middle of the lower electrode than along outermost edges of the lower electrode.

19. The integrated chip of claim 1, wherein the lower electrode is completely confined between the plurality of upper electrodes.

20. The integrated chip of claim 1, wherein the bottommost surface of the lower electrode continuously extends between opposing outermost sidewalls of the lower electrode.

* * * * *